(12) United States Patent
Huang et al.

(10) Patent No.: US 10,638,620 B2
(45) Date of Patent: Apr. 28, 2020

(54) DISPLAY DEVICE

(71) Applicants: BenQ Intelligent Technology (Shanghai) Co., Ltd, Shanghai (CN); BENQ CORPORATION, Taipei (TW)

(72) Inventors: Liu-Yi Huang, New Taipei (TW); Shih-Ho Chen, Taipei (TW)

(73) Assignees: BenQ Intelligent Technology (Shanghai) Co., Ltd, Shanghai (CN); BENQ CORPORATION, Taipei (TW)

( * ) Notice: Subject to any disclaimer, the term of this patent is extended or adjusted under 35 U.S.C. 154(b) by 0 days.

(21) Appl. No.: 16/409,948

(22) Filed: May 13, 2019

(65) Prior Publication Data

US 2019/0357368 A1    Nov. 21, 2019

(30) Foreign Application Priority Data

May 16, 2018    (TW) .............................. 107116682 A

(51) Int. Cl.
| | |
|---|---|
| *H05K 5/00* | (2006.01) |
| *F16M 11/14* | (2006.01) |
| *F16M 11/18* | (2006.01) |
| *G06F 1/16* | (2006.01) |
| *H05K 5/02* | (2006.01) |

(52) U.S. Cl.
CPC .......... *H05K 5/0017* (2013.01); *F16M 11/14* (2013.01); *F16M 11/18* (2013.01); *G06F 1/1601* (2013.01); *H05K 5/0204* (2013.01); *G06F 2200/1612* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,687,939 | A  * | 11/1997 | Moscovitch | F16M 11/14 248/122.1 |
| 6,443,408 | B1 | 9/2002 | Hung | |
| 7,267,312 | B2 * | 9/2007 | Kang | F16M 11/10 16/337 |
| 7,389,963 | B2 * | 6/2008 | Cho | F16M 11/26 248/159 |
| 7,392,965 | B2 * | 7/2008 | Jung | F16M 11/125 248/125.2 |
| 7,636,133 | B1 * | 12/2009 | Hsu | F16M 11/10 248/917 |
| 7,667,957 | B2 * | 2/2010 | Lee | G06F 1/1601 248/917 |

(Continued)

OTHER PUBLICATIONS

Office action of counterpart application by Taiwan IP Office dated Apr. 11, 2019.

(Continued)

*Primary Examiner* — Lisa Lea-Edmonds

(57) ABSTRACT

A display device includes a housing and a bracket stand module. The housing has a first accommodating recess. The bracket stand module includes an adapter, a pivot connecting member and a rotating member. The adapter has a second accommodating recess, and is located and fixed in the first accommodating recess. The rotating member is pivotally connected to the pivot connecting member to rotate relative to the pivot connecting member, and is located and fixed in the second accommodating recess.

21 Claims, 7 Drawing Sheets

(56) References Cited

U.S. PATENT DOCUMENTS

| | | | | |
|---|---|---|---|---|
| 7,810,768 B2* | 10/2010 | Wang | ............... | F16M 11/10 248/176.3 |
| RE42,091 E * | 2/2011 | Moscovitch | ............ | B60R 11/02 348/794 |
| 7,922,133 B2* | 4/2011 | Hsu | ............... | F16M 11/10 248/127 |
| 7,975,975 B2* | 7/2011 | Lee | ............... | F16M 11/046 248/125.9 |
| 7,984,881 B2* | 7/2011 | Liu | ............... | F16M 11/10 248/121 |
| 8,118,273 B2* | 2/2012 | Hamada | ............... | F16M 11/10 248/371 |
| 8,405,959 B2* | 3/2013 | Lee | ............... | F16M 11/046 248/125.2 |
| 8,670,232 B2* | 3/2014 | Bliven | ............... | F16M 11/041 248/917 |
| 8,913,378 B2* | 12/2014 | Bando | ............... | G06F 1/16 361/679.33 |
| 9,591,778 B1* | 3/2017 | Mercier | ............... | G06F 1/16 |
| 2005/0248912 A1* | 11/2005 | Kang | ............... | F16M 11/10 361/679.27 |
| 2007/0008686 A1* | 1/2007 | Jang | ............... | F16M 11/105 361/679.22 |
| 2007/0170321 A1* | 7/2007 | Smed | ............... | F16M 11/14 248/181.1 |
| 2007/0279850 A1 | 12/2007 | Chiang et al. | | |
| 2009/0008520 A1* | 1/2009 | Tien | ............... | F16M 11/041 248/220.22 |
| 2009/0256047 A1* | 10/2009 | Zhao | ............... | F16M 11/10 248/408 |
| 2009/0315837 A1 | 12/2009 | Geiger | | |
| 2010/0176254 A1* | 7/2010 | Sweere | ............... | A47B 21/0073 248/123.11 |
| 2011/0149181 A1* | 6/2011 | Kim | ............... | F16M 11/08 348/836 |
| 2012/0199711 A1* | 8/2012 | Tsai | ............... | F16M 11/14 248/220.22 |

OTHER PUBLICATIONS

Office action of counterpart application by EU Patent Office dated Sep. 18, 2019.

* cited by examiner

DISPLAY DEVICE

This application claims the benefit of Taiwan application Serial No. 107116682, filed May 16, 2018, the subject matter of which is incorporated herein by reference.

BACKGROUND OF THE INVENTION

Field of the Invention

The invention relates in general to a display device, and more particularly to a display device having an accommodating recess.

Description of the Related Art

A conventional display device includes a housing, a display module and a bracket stand module. The display module is configured in the housing, and the housing is connected to the bracket stand module. To provide the housing with a degree of freedom of multiaxial rotation, the bracket stand module usually includes multiple pivot connecting mechanisms projecting and exposed from the housing. However, these pivot connecting mechanisms inevitably render that a projecting length of the bracket stand module in regard to the housing cannot be effectively reduced, such that an object of slimming of the display device can be extremely challenging.

SUMMARY OF THE INVENTION

Therefore, the present invention provides a display device for improving the above issues of the prior art.

A display device is provided according to an embodiment of the present invention. The display device includes a housing and a bracket stand module. The housing has a first accommodating recess. The bracket stand module includes an adapter, a first pivot connecting member and a rotating member. The adapter has a second accommodating recess, and is located and fixed in the first accommodating recess. The rotating member is pivotally connected to the first pivot connecting member to rotate relative to the first pivot connecting member, and is located and fixed in the second accommodating recess.

A display device is provided according to another embodiment of the present invention. The display device includes a housing and a bracket stand module. The housing has a first accommodating recess. The bracket stand module includes an adapter, a first pivot connecting member, a rotating member and a second pivot connecting member. The adapter has a second accommodating recess, wherein the adapter is located and fixed in the first accommodating recess. The rotating member is pivotally connected to the first pivot connecting member and rotatable around a first axial direction, and the rotating member is located and fixed in the second accommodating recess. The second pivot connecting member is disposed within the rotating member and rotatable around a second axial direction, the first axial direction is different from the second axial direction, and the second pivot connecting member is fixed in the rotating member.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
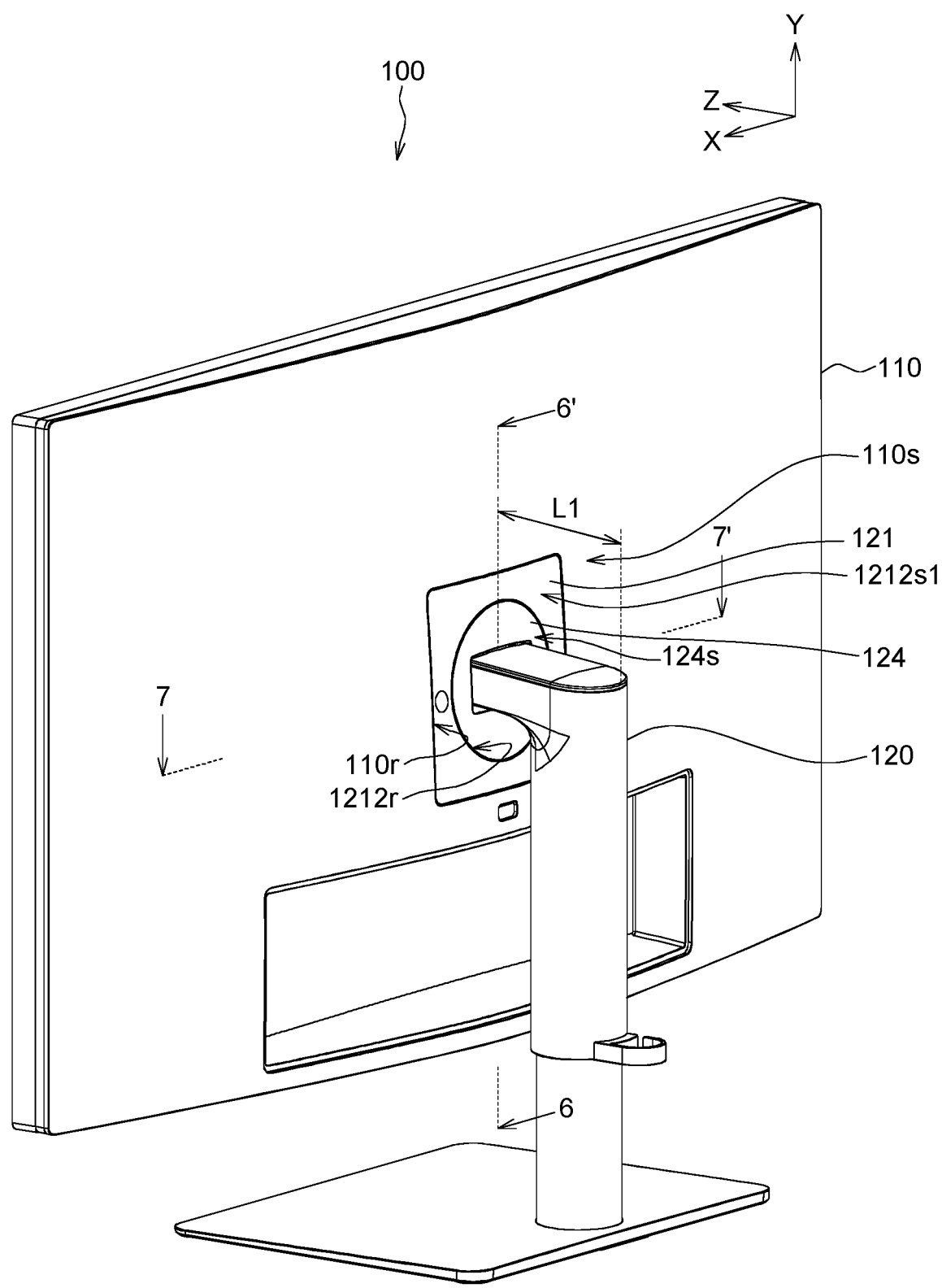
FIG. 1 is an assembly diagram of a display device according to an embodiment of the present invention.
Figure 2:
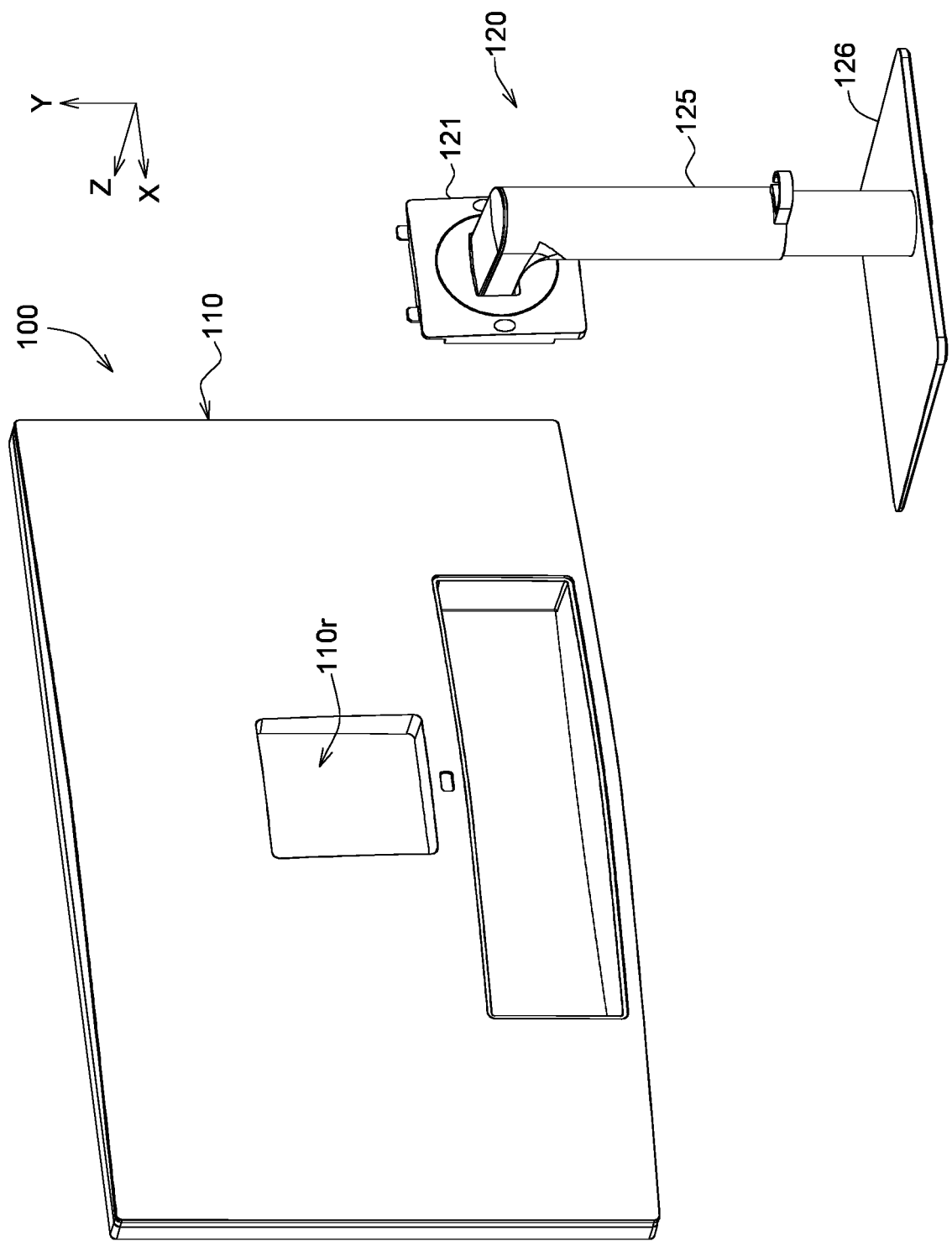
FIG. 2 to FIG. 4 are several exploded diagrams of the display device according to an embodiment of the present invention.
Figure 3:
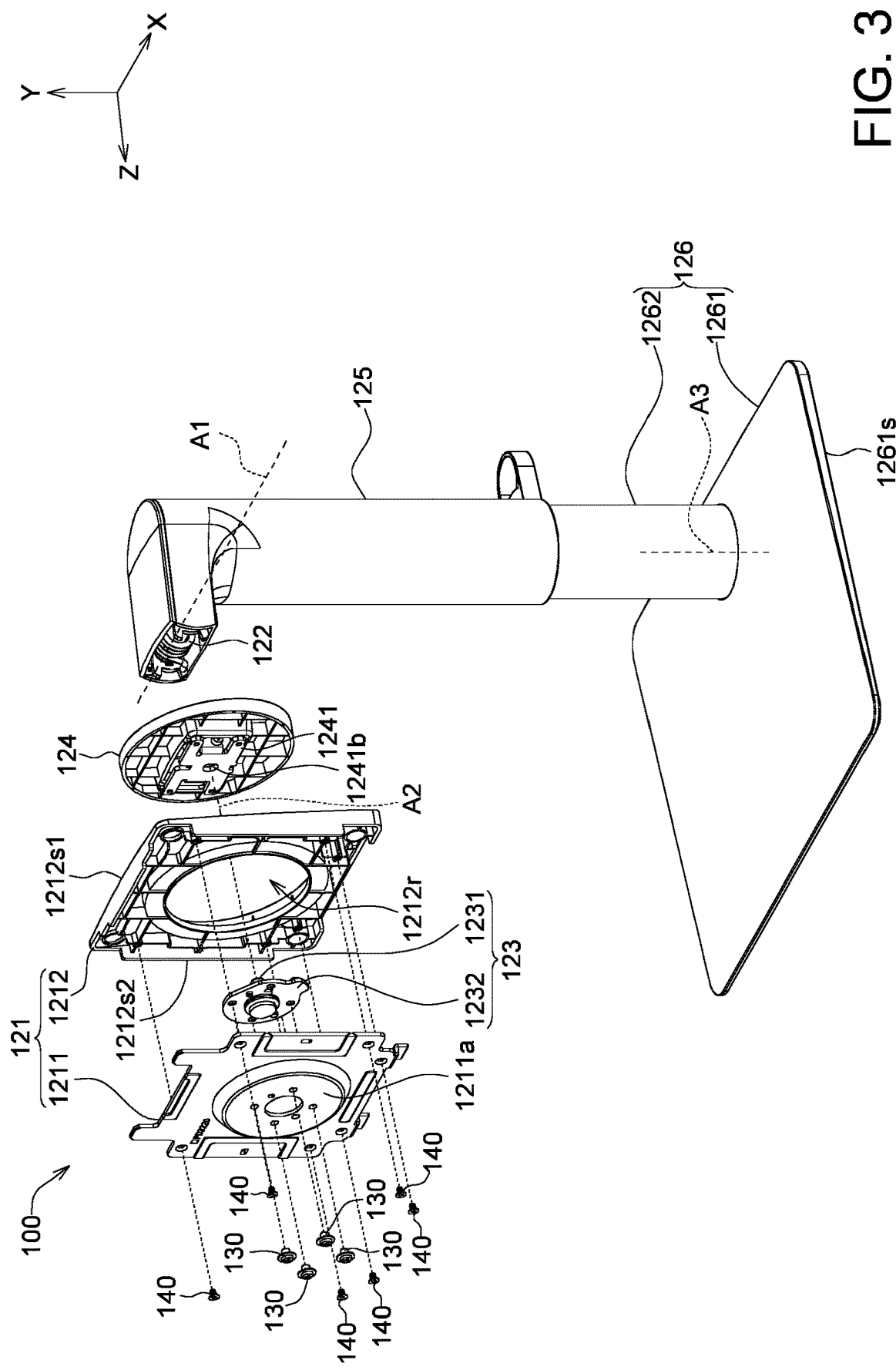
Figure 4:
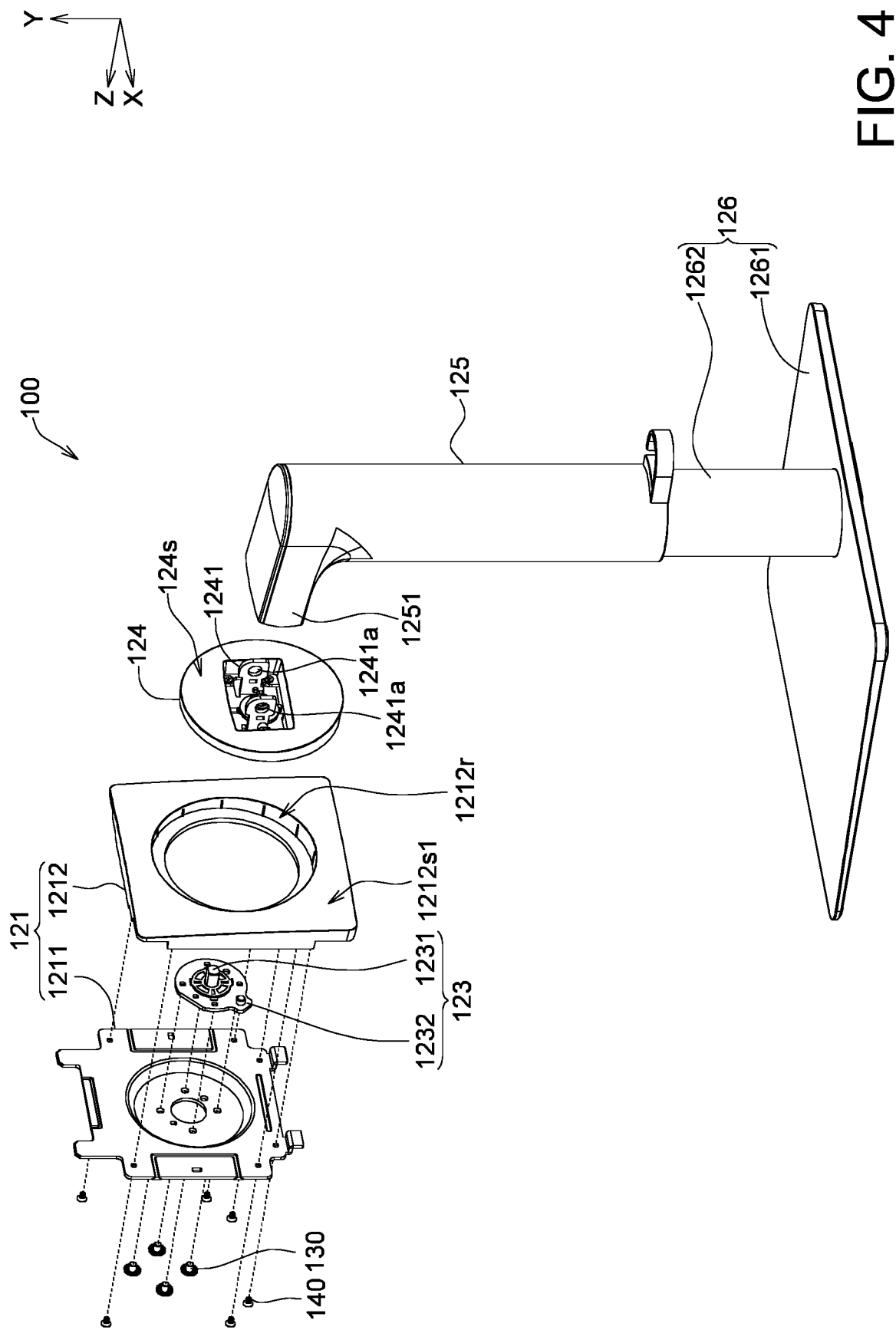
Figure 5:
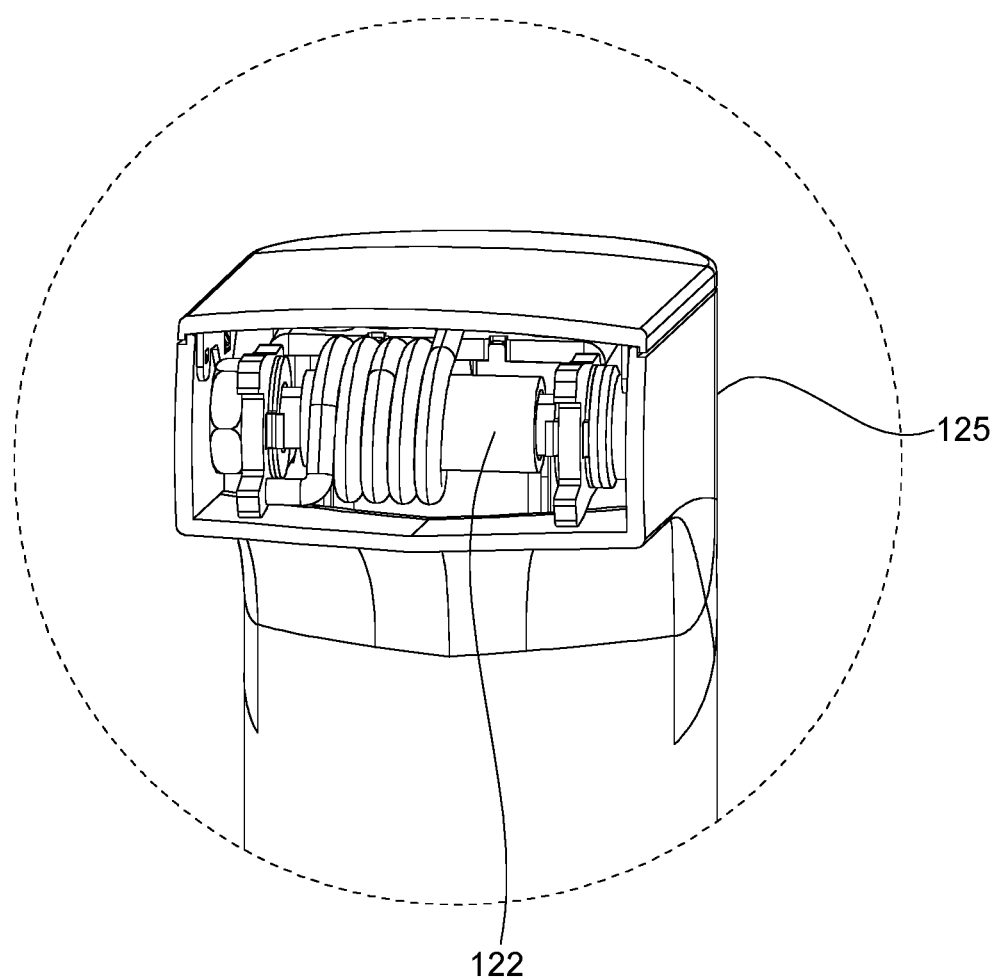
FIG. 5 is an enlarged schematic diagram of a first pivot connecting member and a bracket housing in FIG. 3.

Refer to FIG. 1 to FIG. 5. FIG. 1 shows an assembly diagram of a display device 100 according to an embodiment of the present invention. FIG. 2 to FIG. 4 show several exploded diagrams of the display device 100 in FIG. 1. FIG. 5 shows an enlarged schematic diagram of a first pivot connecting member 122 and a bracket housing 125 in FIG. 3.

As shown in FIG. 1 and FIG. 2, the display device 100 includes a housing 110 and a bracket stand module 120. The housing 110 is, for example, a housing for accommodating a display module, and is an appearance member of the display device 100. The display module is, for example, a liquid-crystal display (LCD) module or any other type of display module. The housing 110 has a first accommodating recess 100r. A part of the bracket stand module 120 is embedded in the first accommodating recess 110r of the housing 110. For example, at least one rotating mechanism of the bracket stand module 120 is embedded in the first accommodating recess 110r of the housing 110. Thus, a projecting length L1 of the bracket stand module 120 relative to the housing 110 can be reduced. Examples are described below.

As shown in FIGS. 1, 3 and 4, the bracket stand module 120 includes an adapter 121, a first pivot connecting member 122, a second pivot connecting member 123, a rotating member 124, a bracket housing 125 and a seat 126. The adapter 121 has a second accommodating recess 1212r, and is located and fixed in the first accommodating recess 110r. The rotating member 124 is pivotally connected to the first pivot connecting member 122 to rotate relative to the first pivot connecting member 122, and is located and fixed in the second accommodating recess 1212r. Thus, when the display device 100 has been assembled, the first pivot connecting member 122 and the rotating member 124 are located (or embedded) in the first accommodating recess 110r of the housing 100, thus reducing the projecting length L1 of the bracket stand module 120 relative to the housing 110 and slimming the thickness of the display device 100.

As shown in FIG. 1 and FIG. 3, the rotating member 124 has a first surface 124s, the adapter 121 has a second surface 1212s1, and the second accommodating recess 1212r is recessed relative to the second surface 1212s1. In this embodiment, when an assembly process is completed, the first surface 124s and the second surface 1212s1 are substantially coplanar. As shown in FIG. 3, the second accommodating recess 1212r is, for example, a penetrated portion. In another embodiment, the second surface 1212s1 can also be withdrawn relative to the first surface 124s or slightly projecting relative to the first surface 124s.

As shown in FIGS. 1, 2 and 3, the housing 110 has a third surface 110s, and the first accommodating recess 110r is recessed relative to the third surface 110s. In this embodiment, when the assembly process is completed, the third surface 110s and the second surface 1212s1 are substantially coplanar. In another embodiment, the second surface 1212s1 can be withdrawn relative to the third surface 110s or slightly projecting relative to the third surface 110s.

As shown in FIGS. 3 to 5, the first pivot connecting member 122 is configured inside the bracket housing 125. In this embodiment, the entire pivot connecting member 122 can be configured inside the bracket housing 125. The rotating member 124 is connected to the first pivot connecting member 122 to perform tilted rotation relative to the first pivot connecting member 122. In one embodiment, the first pivot connecting member 122 includes a first component and a second component connected to each other. The first component and the second component can perform relative tilted rotation. Further, the first component is fixed inside the bracket housing 125, and the second component is fixed at the rotating member 124 such that the rotating member 124 performs tilted rotation relative to the first component by using the second component.

Tilted rotation in the description is, for example, rotating around a first axial direction A1 of the first pivot connecting member 122. In this embodiment, the first axial direction A1 is substantially perpendicular to a normal direction (as a third axial direction A3 in FIG. 3) of a bottom surface 1261s of the seat 126. As shown in FIG. 4 and FIG. 5, the rotating member 124 includes a connecting piece 1241 having at least one connecting hole 1241a. The connecting hole 1241a is connected to the first pivot connecting member 122, enabling the rotating member 124 to rotate relative to the first pivot connecting member 122.

As shown in FIG. 3, the second pivot connecting member 123 is, for example, a friction disc. The second pivot connecting member 123 includes a connecting shaft 1231 and a rotary disc 1232, wherein the rotary disc 1232 can perform pivotal rotation relative to the connecting shaft 1231. Pivotal rotation in the description is, for example, rotating around a center axial direction (e.g., a second axial direction A2) of the connecting hole 1241b. The connecting shaft 1231 can pass through and be fixed at the connecting hole 1241b of the connecting piece 1241 of the rotating member 124, enabling the second pivot connecting member 123 to perform tilted rotation along with the rotating member 124; that is, when the rotating member 124 performs tilted rotation, the second pivot connecting member 123 can perform tilted rotation along with the rotating member 124. In another embodiment, a component of the second pivot connecting member 123 can be fixed at the connecting piece 1241 of the rotating member 124, wherein the component can pivotally rotate relative to the rotary disc 1232 and is, for example, a component other than the connecting shaft 1231.

As shown in FIG. 3, the adapter 121 includes a plate 1211 and an adapter base 1212. The adapter base 1212 has the second accommodating recess 1212r and the second surface 1212s1 described above. The rotating member 124 is movably accommodated in the second accommodating recess 1212r. For example, the rotating member 124 is simply placed in the second accommodating recess 1212r, and the rotating member 124 and the second accommodating recess 1212r (or the adapter base 1212) do not have a fixed relationship therebetween, and so the adapter base 1212 and the rotating member 124 can move relative to each other. For example, the adapter base 1212 and the rotating member 124 can perform relative rotation around the second axial direction A2 of the connecting hole 1241b. In this embodiment, the second axial direction A2 is substantially parallel to a normal direction of a display surface (not shown) of the display module; however, the present invention is not limited to the above example.

As shown in FIG. 3, at least one locking element 130 passes through the plate 1211 and is locked with the rotary disc 1232 of the second pivot connecting member 123, so as to fix the plate 1211 on the rotary disc 1232 of the second pivot connecting member 123. Thus, the plate 1211 can perform pivotal rotation along with the rotary disc 1232 of the second pivot connecting member 123. As shown in the drawing, the plate 1211 includes a protrusion 1211a protruding towards the housing 110, and the locking element 130 passes through the protrusion 1211a of the plate 1211 to fix the plate 1211 on the rotary disc 1232 of the second pivot connecting member 123. In another embodiment, the protrusion 1211a can protrude towards a direction away from the housing 110. In one embodiment, the locking element 130 is, for example, a screw.

Further, as shown in FIG. 3, at least one locking element 140 passes through the plate 1211, and fixes the plate 1211 on the adapter base 1212. Thus, the plate 1211 and the adapter base 1212 becomes an integral structure, so as to jointly perform pivotal rotation relative to the second pivot connecting member 123. As shown in the drawing, the adapter base 1212 has an end surface 1212s2 opposite to the second surface 1212s1. The plate 1211 is fixed on the end surface 1212s2 of the adapter base 1212 by using the locking element 140, so as to fix relative positions of the plate 1211 and the adapter base 1212. In one embodiment, the locking element 140 is, for example, a screw.

It is known from the above description that, the rotating member 124 is pivotally connected to the first pivot connecting member 122, enabling the rotating element 124 and the first pivot connecting element 122 to perform tilted rotation around the first axial direction A1. The connecting shaft 1231 of the second pivot connecting member 123 is fixed at the rotating member 124 to perform tilted rotation along with the rotating member 124. The rotary disc 1232 of the second pivot connecting member 123 is fixed with the adapter 121. Because the rotary disc 1232 can perform pivotal rotation relative to the second axial direction A2, the adapter 121 can also perform pivotal rotation along with the rotary disc 1232 of the second pivot connecting member 123 around the second axial direction A2. Thus, the rotating member 124 and the adapter 121 in overall can perform tilted rotation and/or pivotal rotation relative to the bracket housing 125.

As shown in FIG. 3, the seat 126 includes a base plate 1261 and a sliding track 1262 connected to each other. The bracket housing 125 is slidably connected to the sliding track 1262. Further, the bracket housing 125 is rotatably connected to the sliding track 1262. For example, the bracket housing 125 and the sliding track 126 can perform swivel rotation around the third axial direction A3 perpendicular to the bottom surface 1261s of the base plate 1261, wherein the third axial direction A3 is, for example, a normal direction of the bottom surface 1261s. Thus, the rotating member 124, the adapter 121 and the bracket housing 125 in overall can perform tilted rotation, pivotal rotation and/or swivel rotation relative to the base plate 1261 of the bracket housing 125.

It is known from the above description that, after the housing 110 and the bracket stand module 120 are connected, the housing 110 is provided with degrees of freedom of multiaxial rotation including tilted rotation, pivotal rotation and swivel rotation, so as to adjust the orientation of a display image of the display module configured at the housing 110.

Figure 6:
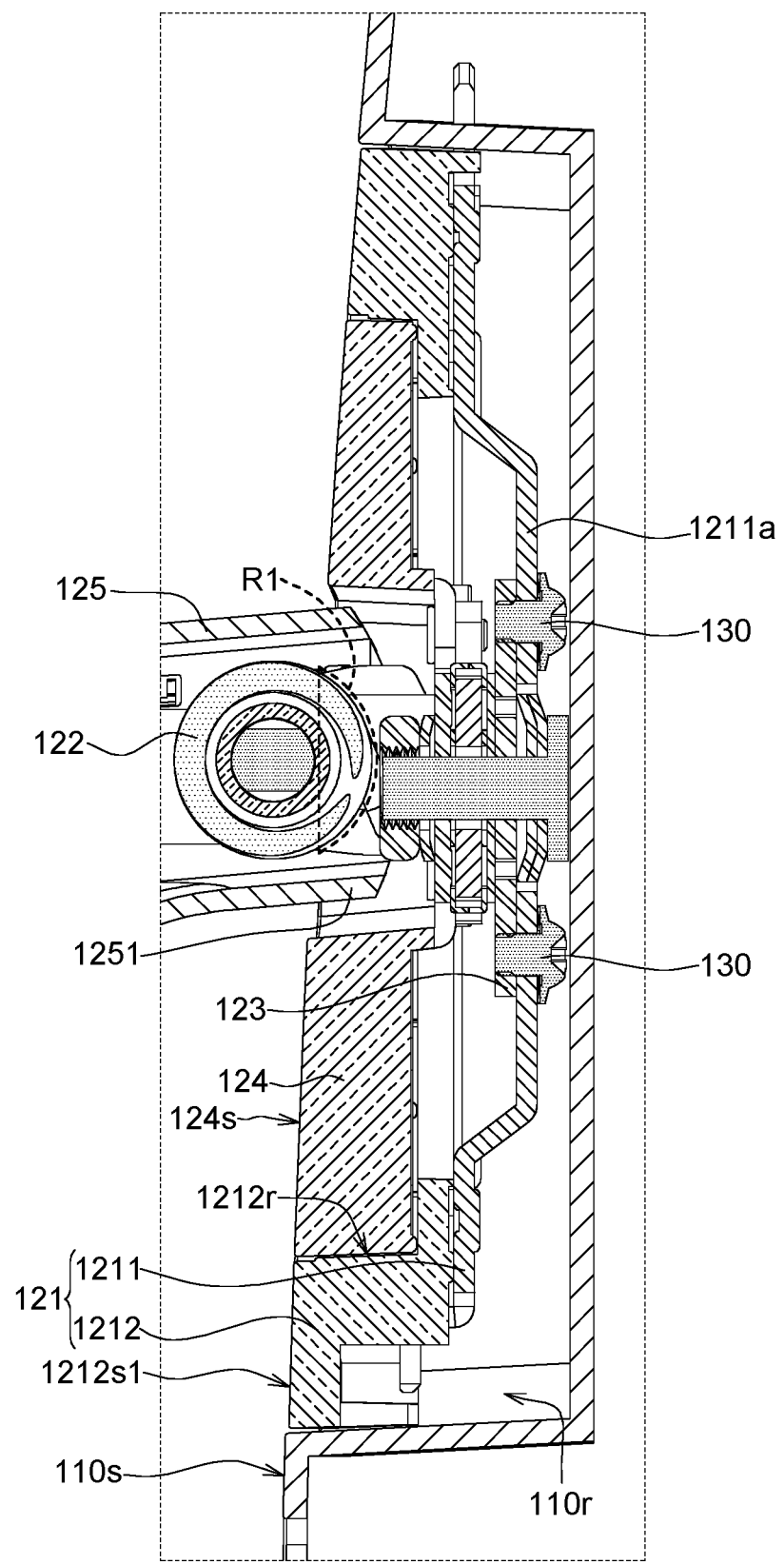
FIG. 6 is a section diagram of the display device in FIG. 1 along a direction 6-6'.
Figure 7:
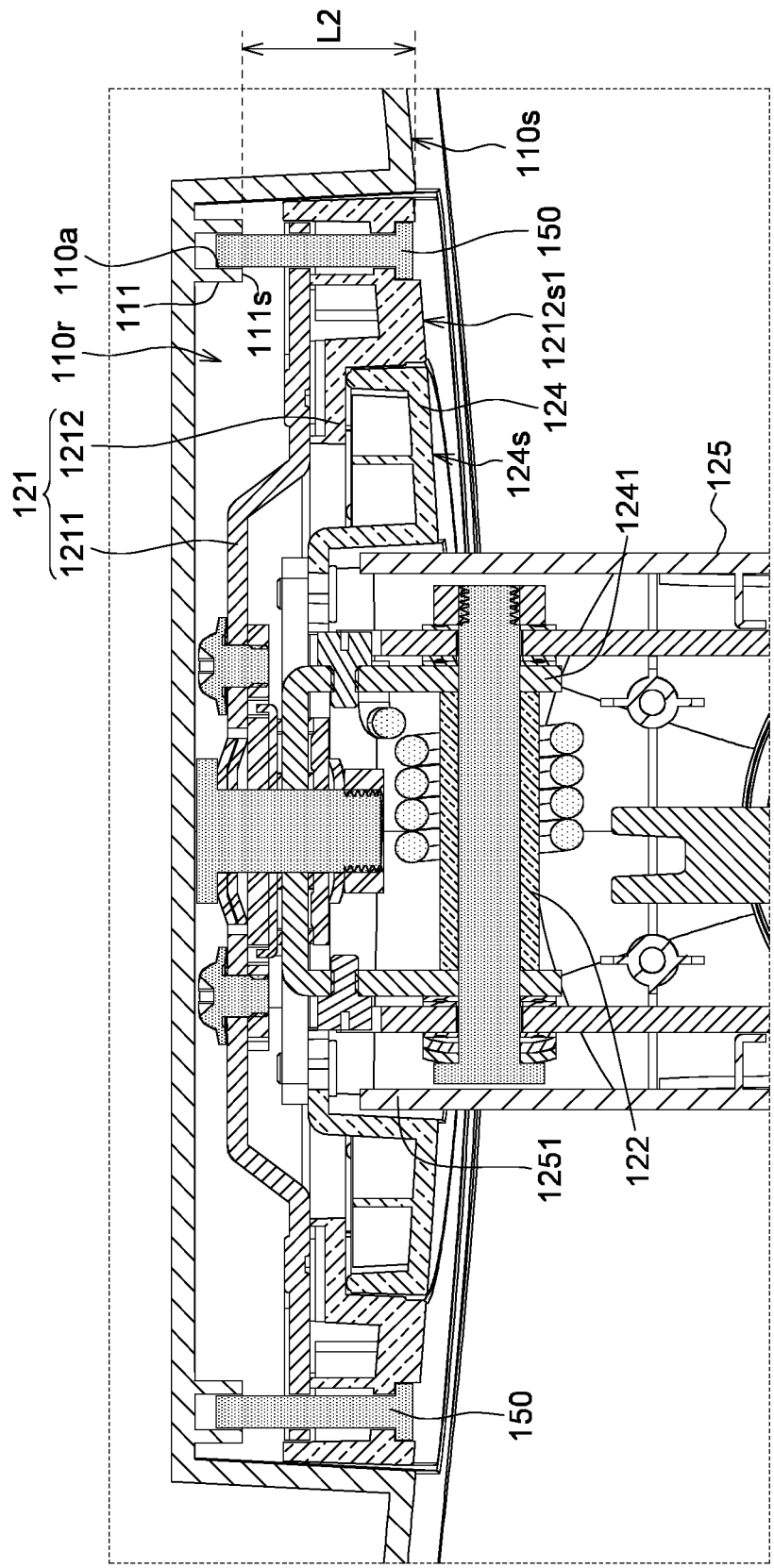
FIG. 7 is a section diagram of the display device in FIG. 1 along a direction 7-7'.

Refer to FIG. 6 and FIG. 7. FIG. 6 shows a section diagram of the display device 100 along a direction 6-6'. FIG. 7 shows a section diagram of the display device 100 along a direction 7-7'. As shown in the drawings, the rotating member 124 is entirely embedded in the second accommodating recess 1212*r* of the adapter 121, and the adapter 121 is entirely embedded in the first accommodating recess 110*r*. However, the present invention is not limited to the above examples. In another embodiment, the rotating member 124 can protrude relative to the second surface 1212*s*1 of the adapter base 1212, and/or the adapter 121 can protrude relative to the third surface 110*s* of the housing 110.

As shown in FIG. 6, a front end 1251 of the bracket housing 125 is located in the second accommodating recess 1212*r*, and the first pivot connecting member 122 is configured at the front end 1251 of the bracket housing 125. Thus, the first pivot connecting member 122 and the second accommodating recess 1212*r* are partially overlapped (as shown by an overlapping region R1). Accordingly, the projecting length L1 (the projecting length L1 is depicted in FIG. 1) of the bracket stand module 120 relative to the housing 110 can be reduced, so as to slim the thickness of the display device 100.

As shown in FIG. 6, a recess of the protrusion 1211*a* of the plate 1211 can accommodate an component, for example, the second pivot connecting member 123, such that the rotating member 124 and the adapter base 1212 can be located close to the first accommodating recess 110*r*, hence reducing the projecting length L1 of the bracket stand module 120 relative to the housing 110 and slimming the thickness of the display device 100.

As shown in FIG. 7, the housing 110 has at least one fixing hole 110*a*. A locking element 150 passes through the adapter base 1212 and fixes the adapter base 1212 at the housing 110, so as to fix the relative positions of the adapter 121 and the housing 110. In one embodiment, the locking element 150 is a screw, and the fixing hole 110*a* is a screw hole. A distance L2 from the second surface 1212*s*1 to the fixing hole 110*a* is not greater than 10 mm, and it is then evident that the embodiment of the present invention is capable of accommodating the adapter 121, the second pivot connecting member 123 and the rotating member 124 in a limited space (e.g., a 10-mm space) of the first accommodating recess 110*r*. As shown in FIG. 6, the housing 110 includes at least one bearing seat 111, and the fixing hole 110*a* extends inwards from an end surface 111*s* of the bearing seat 111. The distance L2 is a distance between the second surface 1212*s*1 and the end surface 111*s*. In another embodiment, if not required, the bearing seat 111 can also be omitted.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
    a housing having a first accommodating recess; and
    a bracket stand module, comprising:
        an adapter having a second accommodating recess, wherein the adapter is located and fixed in the first accommodating recess;
        a first pivot connecting member; and
        a rotating member pivotally connected to the first pivot connecting member to pivotally rotate relative to the first pivot connecting member, wherein the rotating member is located and fixed in the second accommodating recess;
    wherein the adapter is movable relative to the rotating member.

2. The display device according to claim 1, wherein the rotating member has a first surface, the adapter member has a second surface, the second accommodating recess is recessed relative to the second surface, and the first surface and the second surface are substantially coplanar.

3. The display device according to claim 1, wherein the housing has a third surface, the first accommodating recess is recessed relative to the third surface, the adapter has a second surface, the second accommodating recess is recessed relative to the second surface, and the second surface and the third surface are substantially coplanar.

4. The display device according to claim 1, wherein the adapter has a second surface, the second accommodating recess is recessed relative to the second surface, the housing has a fixing hole, and a distance from the second surface to the fixing hole is not greater than 10 mm.

5. The display device according to claim 1, wherein the bracket stand module further comprises a second pivot connecting member, the second pivot connecting member is rotatably provided in the rotating member, and the adapter is fixed with the second pivot connecting member to enable the adapter to rotate relative to the second pivot connecting member.

6. The display device according to claim 1, wherein the adapter comprises:
    an adapter base having an end surface; and
    a plate fixed on the end surface of the adapter base and having a protrusion protruding towards the housing, wherein the protrusion of the plate is fixed with the second pivot connecting member.

7. The display device according to claim 1, wherein the bracket stand module has a bottom surface, the rotating member is rotatable around a first axial direction and rotatably pivotally connected to the first pivot connecting member, and the first axial direction is substantially perpendicular to a normal direction of the bottom surface.

8. The display device according to claim 1, wherein the adapter is rotatable relative to the rotating member around a second axial direction, and the second axial direction is substantially parallel to a normal direction of a display surface.

9. The display device according to claim 1, wherein the bracket stand module further comprises a bracket housing, and the first pivot connecting member is entirely provided in the bracket housing.

10. The display device according to claim 9, wherein the first pivot connecting member is configured at a front end of the bracket housing, and the front end is located in the second accommodating recess such that the first pivot connecting member at least partially overlaps with the second accommodating recess.

11. The display device according to claim 1, wherein the rotating member is entirely embedded in the second accommodating recess of the adapter, and the adapter is entirely embedded in the first accommodating recess.

12. A display device, further comprising:
 a housing having a first accommodating recess; and
 a bracket stand module, comprising:
  an adapter having a second accommodating recess, wherein the adapter is located and fixed in the first accommodating recess;
  a first pivot connecting member; and
  a rotating member pivotally connected to the first pivot connecting member and rotatable around a first axial direction, and the rotating member is located and fixed in the second accommodating recess;
  a second pivot connecting member disposed within the rotating member and rotatable around a second axial direction, the first axial direction is different from the second axial direction, and the second pivot connecting member is fixed in the rotating member.

13. The display device according to claim 12, wherein the rotating member has a first surface, the adapter member has a second surface, the second accommodating recess is recessed relative to the second surface, and the first surface and the second surface are substantially coplanar.

14. The display device according to claim 12, wherein the housing has a third surface, the first accommodating recess is recessed relative to the third surface, the adapter has a second surface, the second accommodating recess is recessed relative to the second surface, and the second surface and the third surface are substantially coplanar.

15. The display device according to claim 12, wherein the adapter has a second surface, the second accommodating recess is recessed relative to the second surface, the housing has a fixing hole, and a distance from the second surface to the fixing hole is not greater than 10 mm.

16. The display device according to claim 12, wherein the adapter comprises:
 an adapter base having an end surface; and
 a plate fixed on the end surface of the adapter base and having a protrusion protruding towards the housing, wherein the protrusion of the plate is fixed with the second pivot connecting member.

17. The display device according to claim 12, wherein the bracket stand module further comprises a bracket housing, and the first pivot connecting member is entirely provided in the bracket housing.

18. The display device according to claim 12, wherein the first pivot connecting member is configured at a front end of the bracket housing, and the front end is located in the second accommodating recess such that the first pivot connecting member at least partially overlaps with the second accommodating recess.

19. The display device according to claim 12, wherein the rotating member is entirely embedded in the second accommodating recess of the adapter, and the adapter is entirely embedded in the first accommodating recess.

20. A display device, comprising:
 a housing having a first accommodating recess; and
 a bracket stand module, comprising:
  an adapter having a second accommodating recess, wherein the adapter is located and fixed in the first accommodating recess;
  a first pivot connecting member; and
  a rotating member pivotally connected to the first pivot connecting member to pivotally rotate relative to the first pivot connecting member, wherein the rotating member is located and fixed in the second accommodating recess;
 wherein the adapter is rotatable relative to the rotating member around a second axial direction, and the second axial direction is substantially parallel to a normal direction of a display surface.

21. A display device, comprising:
 a housing having a first accommodating recess; and
 a bracket stand module, comprising:
  an adapter having a second accommodating recess, wherein the adapter is located and fixed in the first accommodating recess;
  a first pivot connecting member; and
  a rotating member pivotally connected to the first pivot connecting member to pivotally rotate relative to the first pivot connecting member, wherein the rotating member is located and fixed in the second accommodating recess;
 wherein the bracket stand module further comprises a bracket housing, and the first pivot connecting member is entirely provided in the bracket housing.

* * * * *